United States Patent [19]

Heubes

[11] Patent Number: 4,979,512

[45] Date of Patent: Dec. 25, 1990

[54] PULSE SEQUENCE WITH NON-CONSTANT SCAN REPETITION TIME FOR A NUCLEAR MAGNETIC RESONANCE TOMOGRAPHY APPARATUS

[75] Inventor: Peter Heubes, Poxdorf, Fed. Rep. of Germany

[73] Assignee: Siemens Aktiengesellschaft, Berlin and Munich, Fed. Rep. of Germany

[21] Appl. No.: 379,056

[22] Filed: Jul. 13, 1989

[30] Foreign Application Priority Data

Jul. 22, 1988 [EP] European Pat. Off. .......... 8811873.1

[51] Int. Cl.⁵ .............................................. A61B 5/055
[52] U.S. Cl. .................................. 128/653 A; 324/309
[58] Field of Search ...................... 128/653 A; 324/309

[56] References Cited

U.S. PATENT DOCUMENTS 4,647,858  3/1987  Bottomley ........................... 324/320

FOREIGN PATENT DOCUMENTS

| 0117725 | 9/1984 | European Pat. Off. ........ 128/653 A |
| 59-24116 | 2/1984 | Japan . |
| WO87/00922 | 2/1987 | PCT Int'l Appl. ............. 128/653 A |
| 2139764 | 11/1984 | United Kingdom . |

OTHER PUBLICATIONS

"Pulsed Magnetic-Field Gradient Program for Studying Diffusion of Absorbed Molecules by the Spin-Echo Method", Anisimov et al., Instrumentation and Experimental Techniques, vol. 21, No. ½, 1978, pp. 134–136.

"Magnetic Resonance Imaging with Respiratory Gating: Techniques and Advantages", Ehman et al., American Roentgen Ray Society AJR 143, Dec. 1984, pp. 1175–1182.

Primary Examiner—Ruth S. Smith
Attorney, Agent, or Firm—Hill, Van Santen, Steadman & Simpson

[57] ABSTRACT

A pulse sequence is disclosed for a nuclear magnetic resonance tomography apparatus wherein the scans are executed with a non-constant repetition time, such as due to ECG triggering. Normally, the non-constancy of the repetition time in a nuclear magnetic resonance tomography apparatus results in a deterioration of the quality of the images, due to eddy currents. In the pulse sequence disclosed herein, gradient pulses having a chronological mean value are inserted in the pause between two successive scans, this chronological mean value being equal to the chronological mean value of the corresponding gradients during the scans. The disturbing influence of variable repetition times on the image quality is thus eliminated.

4 Claims, 3 Drawing Sheets $B_i(r,\vartheta,\varphi)\cdot e^{-t/\tau}$ $B_i(r,\vartheta,\varphi)\{b+a\cdot e^{-t/\tau}\}$

PULSE SEQUENCE WITH NON-CONSTANT SCAN REPETITION TIME FOR A NUCLEAR MAGNETIC RESONANCE TOMOGRAPHY APPARATUS

BACKGROUND OF THE INVENTION

1. Field of the Invention

The present invention is directed to a pulse sequence for a nuclear magnetic resonance tomography apparatus wherein the repetition time of the scans is not constant.

2. Description of the Prior Art

Nuclear magnetic resonance tomography devices are known in the art wherein an examination subject is disposed in a fundamental magnetic field, and is further subjected to a sequence of gradient magnetic fields. A RF coil generates a sequence of RF pulses, which result in nuclear magnetic resonance signals being generated within the examination subject. An RF pick-up system acquires the nuclear magnetic resonance signals, from which an image of the examination subject is constructed. By selectively switching the gradient fields on and off during a scan, an image of a selected slice of the examination subject can be obtained.

As used herein, the term "scan" means the execution of a measuring event for producing an individual Fourier projection. A matrix, from which an image is acquired by two-dimensional or three-dimensional Fourier transformation, is obtained based on the measured values of a number of scans, which are repeated with a repetition time.

A non-constant repetition time in the pulse sequences comprising a scan can occur, for example, if the measurements are triggered dependent on movements of the examination subject. For example, such triggering can ensue on the basis of respiration as described, for example, in European Specification 0 117 725 and in the article "Magnetic Resonance Imaging With a Respiratory Gating," American Roentgen Ray Society, AJR 143, pages 1175-1182, Dec. 1984. Triggering based on the patient's ECG signal is also frequently employed for examinations in the region of the heart. The purpose of triggering the scan dependent upon the motion of the patient is to prevent or reduce image artefacts caused by such motion. This means, however, that the repetition time of the scans is no longer constant, but is instead dependent upon the respective motion, such a respiration or heart beat.

The absence of a constancy of the repetition time results in a deterioration of the quality of the NMR images due to eddy currents, as is described in greater detail below.

SUMMARY OF THE INVENTION

It is an object of the present invention to provide a pulse sequence for use in a nuclear magnetic resonance tomography device with non-constant scan repetition times, wherein the formation of eddy currents does not result in a deterioration in the quality of the images.

The above object is achieved in accordance with the principles of the present invention in a pulse sequence wherein additional gradient pulses are inserted in the pause between two successive scans, with the inserted gradient pulses having a chronological mean value which is equal to the chronological mean value of the gradients applied during the scan.

DESCRIPTION OF THE PREFERRED EMBODIMENTS

Figure 1:
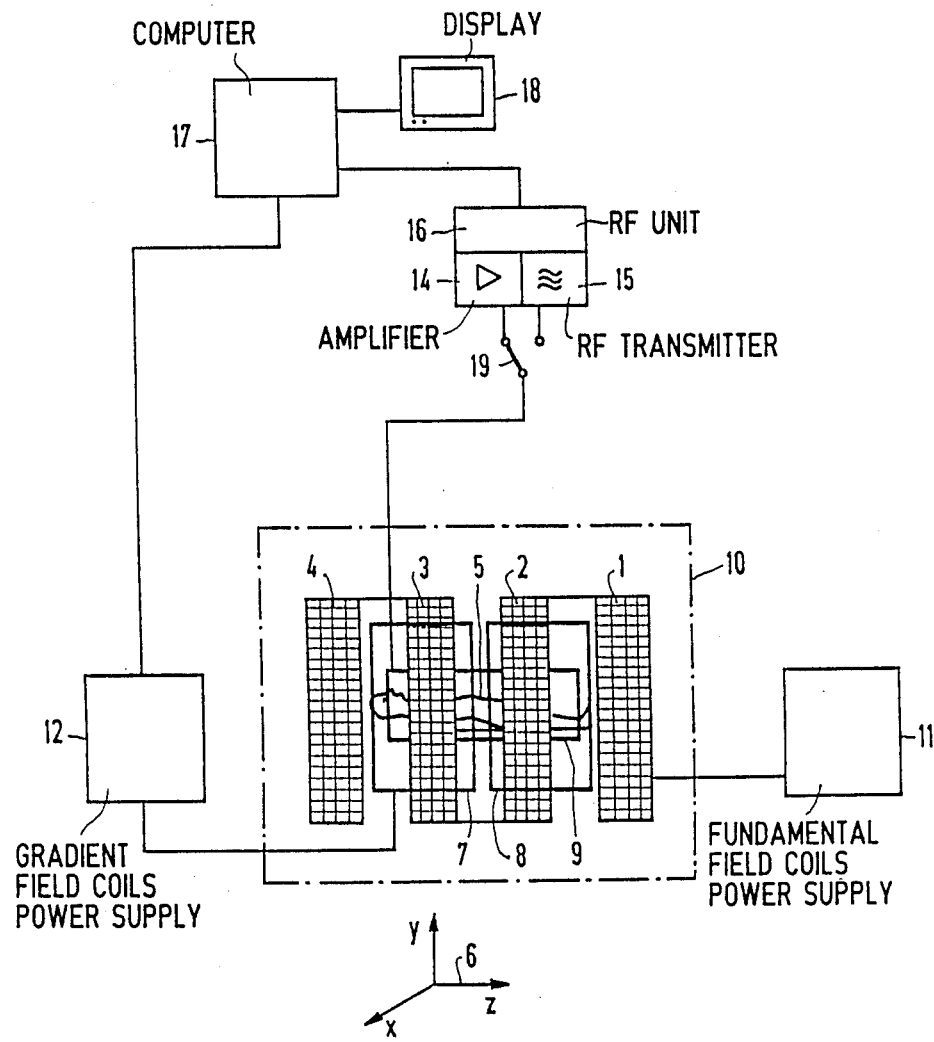
FIG. 1 is a schematic block diagram of a typical nuclear magnetic resonance tomography apparatus which can be operated using the pulse sequence in accordance with the principles of the present invention.

A typical nuclear magnetic resonance tomography apparatus is schematically shown in FIG. 1 for producing images of an examination subject. Fundamental field coils 1, 2, 3, and 4 generate a fundamental magnetic field in which the patient 5 is disposed for medical diagnostics. Respective sets of gradient field coils are provided for generating independent orthogonal magnetic gradients in the x, y and z directions, as indicated in the coordinate system 6. For clarity, only gradient coils 7 and 8 are shown in FIG. 1, which generate the x-gradient in combination with a pair of identical gradient coils disposed on the opposite side of the patient 5. Another set of coils (not shown) generate the y-gradient, and are disposed parallel to the patient 5 above and below the patient 5. A further set of coils (not shown) generate the z-gradient, and are disposed transversely relative to the longitudinal axis of the patient 5 at the head and feet of the patient 5.

The apparatus also includes a RF coil 9 which produces and acquires nuclear magnetic resonance signals in the patient 5. The coils 1, 2, 3, 4, 7, 8 and 9 bounded by the dot-dash line 10 represent the actual examination instrument.

The instrument is operated by electrical components including a power supply 11 for the fundamental field coils 1 through 4, and a gradient field coils power supply 12 which supplies power to the gradient coils 7 and 8 and the other gradient coils. The RF coil 9 is coupled via a signal amplifier 14, or an RF transmitter 15, to a process control computer 17. The computer 17 is connected to a monitor 18 on which the image of the patient 5 is displayed. The amplifier 14 and the RF transmitter are part of an RF unit 16 for signal generation and acquisition. A switch 19 enables switching between a signal generating (transmission) mode and a signal receiving (data acquisition) mode.

An image of a selected slice of the patient 5 is generated in a known manner by exciting nuclear spins in the patient 5 by pulses applied by the RF coil 9. The resulting nuclear magnetic resonance signals are received by the same RF coil 9. A spatial selection of the signals is achieved by applying selected gradient fields. An image is produced from these signals using multi-dimensional Fourier reconstruction methods. A number of different pulse sequences are known to those skilled in the art, however, the present invention is not dependent upon the particular pulse sequence which is used. One example of a suitable pulse sequence is described in the aforementioned European Specification 0 117 725.

Figure 2:
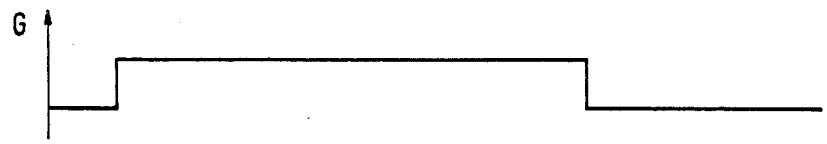
FIG. 2 is a graph showing a representative gradient pulse which can be used in the apparatus of FIG. 1.
Figure 3:
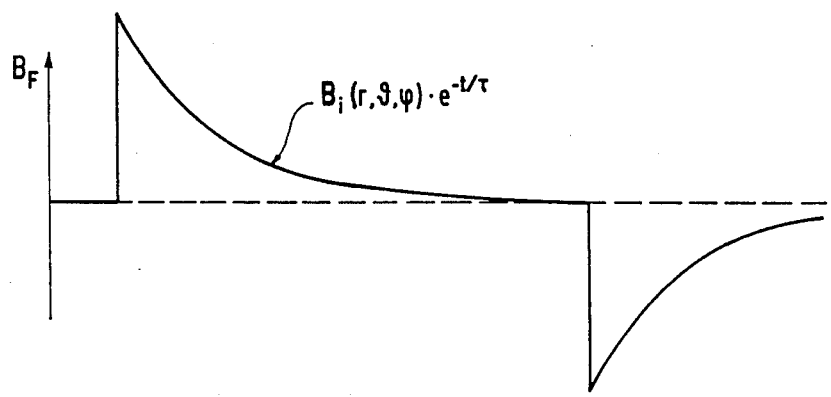
FIG. 3 is a graph showing the field error caused by eddy currents resulting from the application of the gradient shown in FIG. 2.

For explaining the problem solved by the method disclosed herein, FIG. 2 shows a single gradient pulse G, and FIG. 3 shows the associated field error $B_F$ caused by eddy currents. As is known, the flux changes triggered by the pulsed mode of the gradient coils induce currents in all electrically conductive parts. These currents are directed such that their intrinsic field opposes the direction of the penetrating flux. It is mainly the metallic walls of the cryostat which contribute, in nuclear resonance tomography devices, to the generation of such eddy currents as electrically conductive parts, however, all metallic components of the RF resonators also make a contribution. The structural shapes and positions of these components cause the induced eddy currents not to be ideal mirror currents, but instead a diffusely broadened and projected image of the primary currents in the gradient coils results. The spatial field distributions as a consequence of the primary current and the eddy current are thus not identical. Only the field component which is shared by both currents can be set to a selected time dependency by an appropriately modified excitation of the gradient coils. This procedure is usually referred to as "eddy current compensation." All field components which decay with significant, specific time constants, such as the eddy currents, remain. These chronologically variable field components are referred to below as the dynamic field errors $B_F$.

Field errors which are neither spatially nor chronologically constant are produced in the pulsed mode of the gradient coils and thus can deteriorate the quality of NMR images.

As shown in FIG. 3, eddy currents are produced at each edge of the gradient pulse G, and decay exponentially, so that the corresponding field error $B_F$ also decays exponentially. As illustrated in FIG. 3, a decay with a single time constant is assumed for simplification. Further contributions will also be made, however, when the decay event of the field error $B_F$ ensues given the presence of a number of different time constants.

A repeated excitation of the gradient coils during a time which is short compared to, or comparable, the eddy current time constant $\tau$ leads to a superpositioning of the the field errors $B_F$ triggered by the individual switch events. If the field error generated at a point in time $t_i$ by the switching of a gradient current is referenced $B_i (r, \theta, \phi)$, then the overall error at a point in time t $(t > t_i)$ is:

$$B(r, \theta, \phi, t) = \sum_{i=1}^{N} B_i (r, \theta, \phi) e^{-(t-t_i)/\tau}$$

wherein r, $\theta$, $\phi$ are spherical coordinates.

Figure 4:
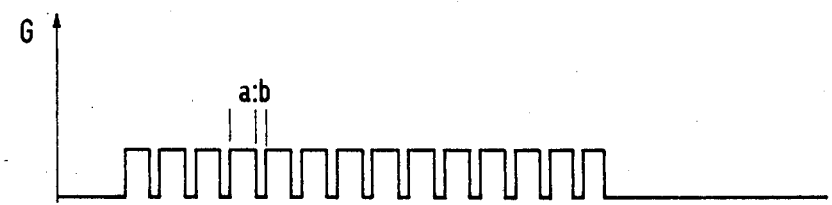
FIG. 4 is a graph showing a periodic gradient which can be used in the tomography apparatus of FIG. 1.
Figure 5:
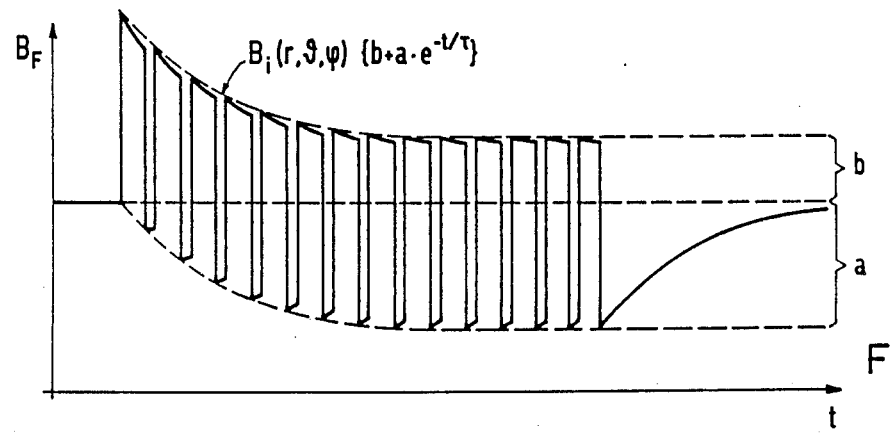
FIG. 5 is a graph showing the field error caused by eddy currents resulting from the application of the gradient shown in FIG. 4.

An example of the above is shown in FIGS. 4 and 5. As shown in FIG. 4, a gradient coil is excited with pulses having a constant amplitude and an on/off ratio a:b. The corresponding curve of the standardized field error $B_F$ is shown in FIG. 5. After a transient effect having a duration defined by the eddy current time constants $\tau$, a dynamic equilibrium of the field errors $B_F$ is established, derived from the chronological mean value of the applied gradient strength. After the end of the pulse sequence, the field error $B_F$ returns to zero proceeding from this value.

The effects of the field error shown in FIG. 5 on the quality of the NMR images shall now be discussed. The imaging event is normally composed of serial measurements of the Fourier projections required for image formatting. The execution of the measurements necessary for a Fourier projection is referred as a scan, so that the overall measurement is composed of a serial succession of scans. As shown in FIG. 4, the gradient fields are multiply switched during a scan. When the scans are applied in a strictly periodic fashion, i.e., when the repetition time $T_R$ of the scans is constant, the same image errors occur from scan to scan. Usually no pronounced image disturbances will arise, because of the equivalency. If, for example, the eddy current time constants are long compared to the duration of a scan, the field errors $B_F$ merely result in geometric distortions, as are also caused by static field inhomogeneities.

Special problems arise, however, given nonperiodic execution of the scans, i.e., given a non-constant repetition time $T_R$. These special problems are resolved by the method disclosed herein. Such problems arise, for example, given imaging which is triggered dependent upon the motion of the patient, for example given ECG triggering. Each scan is then triggered by a selected feature of the ECG signal of the patient, so that the repetition times are dependent on the heart activity, and are thus no longer constant.

Figure 6:
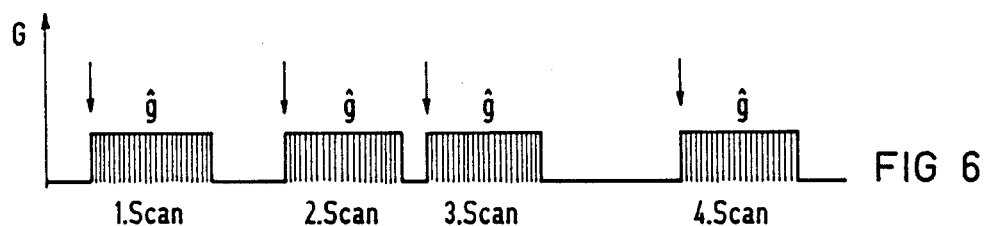
FIG. 6 is a representative gradient having chronologically varying pauses which can be used in the tomography apparatus of FIG. 1.

Such a situation is shown in FIG. 6. The pulses within a scan are no longer shown individually resolved, but are instead shown in the form of their envelopes. The decisive characteristic of these pulses is the chronological mean value $\hat{g}$ of the gradient strength during an individual scan. The chronological mean value $\hat{g}$ defines the steady state condition toward which the field errors $B_F$ tend, proceeding from different initial conditions at the beginning of a scan.

Figure 7:
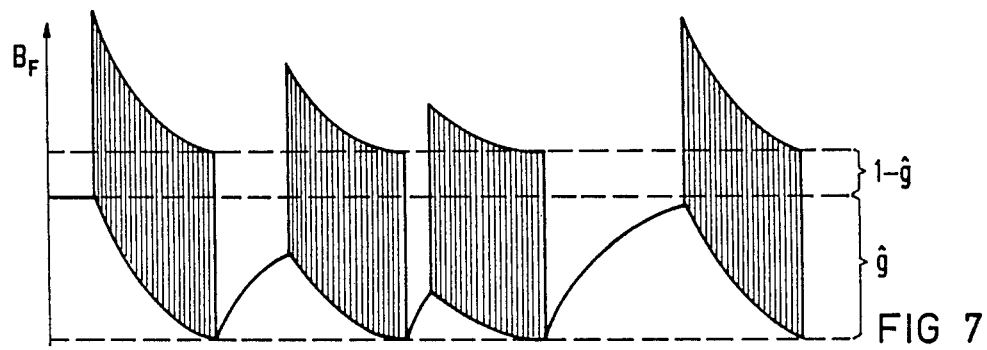
FIG. 7 is a graph showing the field error caused by eddy currents resulting from the application of the gradient of FIG. 6.

As shown in FIG. 7, the field errors resulting from the gradient pulse sequence shown in FIG. 6 now differ from scan to scan as a consequence of the different chronological spacing between the individual scans. Only the envelopes of the standardized field errors $B_F$ are shown in FIG. 7. One can see that the field errors $B_F$ are dependent on the repetition time with a given eddy current time constant, with the field errors $B_F$ becoming increasingly different as the repetition time becomes shorter. The differences in the field errors $B_F$ become negligibly small only when the repetition time is significantly longer than the eddy current time constant.

Depending upon the imaging method and reconstruction algorithm used, the difference between the field errors $B_F$ during the individual scans leads to image disturbances which may be considerable. In two-dimensional and three-dimensional Fourier reconstruction methods, for example, significant artefacts in the direction of the phase-coded image axes result because of the sensitivity of the Fourier transformation to phase errors.

The inventive method is based upon keeping the amount of the field error $B_F$ constant from scan to scan, despite the varying repetition time $T_R$ to simulate the field error which would be present given a strictly periodic succession of scans.

Figure 8:
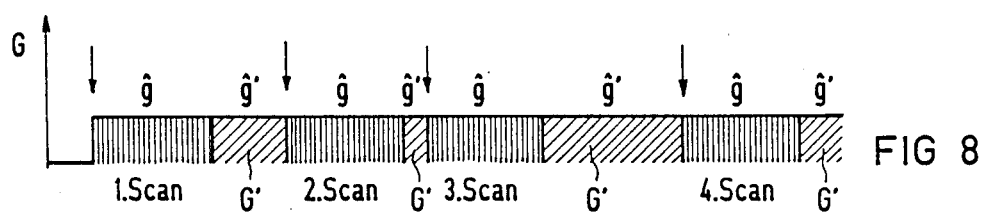
FIG. 8 is a graph showing the gradient of FIG. 6 with additional gradient pulses inserted in the pauses in accordance with the principles of the present invention.

This is achieved in accordance with the principles of the present invention by applying further gradient pulses G', as shown in FIG. 8, during the chronologically varying pauses between the scans, in addition to the gradient pulses needed during each scan for imaging. It is important that the chronological mean value $\hat{g}$ of the scan gradient strength is always the same during each scan duration (the scan durations being constant from scan to scan) and the mean value $\hat{g}'$ of the inserted gradient strength is always the same during the variable pause time. For example, this is accomplished when the gradient G' in the pauses is switched on with a constant mean value amplitude $\hat{g}'$, with $\hat{g} = \hat{g}'$. The gradient pulses G' may consist of a single pulse or a plurality of individual pulses.

Figure 9:
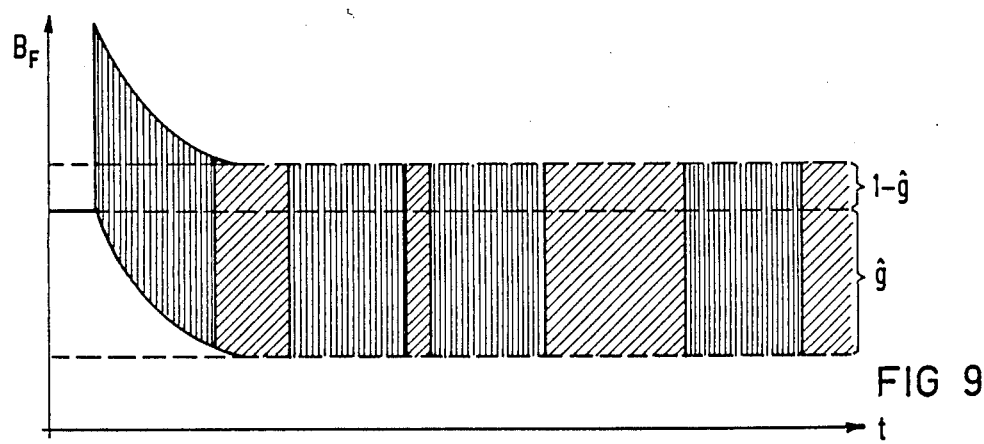
FIG. 9 is a graph showing the field error caused by eddy currents resulting from the application of the gradients shown in FIG. 8.

The curve of the standardized field error $B_F$ resulting from the pulse sequence of FIG. 8 is shown in FIG. 9. The shaded regions identify the contributions of the additional gradient G' which assure the field errors $B_F$, which are now always constant after a one-time transient effect, do not trigger any scan-dependent disturbances during the entire measurement. The aforementioned image artefacts caused by different field errors from scan to scan are thus avoided.

Although modifications and changes may be suggested by those skilled in the art, it is intention of the inventor to embody within the patent warranted hereon all changes and modifications as reasonably and properly come within the scope of his contribution to the art.

I CLAIM AS MY INVENTION:

1. A method for operating a nuclear magnetic resonance tomography apparatus to obtain an image of an examination subject comprising the steps of:

conducting a plurality of successive scans each including periodically switched gradient fields with non-constant pauses between successive scans, said scans having a chronological gradient field strength mean value;

generating an inserted gradient field during each of said pauses between said successive scans, said inserted gradient fields having a chronological gradient field strength mean value equal to said chronological gradient field strength mean value of the scan gradient fields; and constructing an image of a selected slice of said examination subject using nuclear magnetic resonance signals acquired from said examination subject during each of said scans.

2. A method as claimed in claim 1, comprising the additional step of:

triggering each of said scans based on a body function motion of said examination subject.

3. A method as claimed in claim 1, wherein the step of generating an inserted gradient field is further defined by generating an inserted gradient field as a continuous gradient pulse between two successive scans.

4. A method as claimed in claim 1, wherein the step of generating an inserted gradient field is further defined by generating a sequence of individual gradient pulses between two successive scans.

* * * * *